(12) United States Patent
Abramzon

(10) Patent No.: US 10,630,461 B2
(45) Date of Patent: Apr. 21, 2020

(54) EFFICIENT FREQUENCY DETECTORS FOR CLOCK AND DATA RECOVERY CIRCUITS

(71) Applicant: Samsung Display Co., Ltd., Yongin-si, Gyeonggi-do (KR)

(72) Inventor: Valentin Abramzon, Mountain View, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/197,252

(22) Filed: Nov. 20, 2018

(65) Prior Publication Data
US 2020/0092077 A1 Mar. 19, 2020

Related U.S. Application Data

(60) Provisional application No. 62/732,942, filed on Sep. 18, 2018.

(51) Int. Cl.
*H04L 7/033* (2006.01)
*H03L 7/08* (2006.01)
*H03L 7/087* (2006.01)

(52) U.S. Cl.
CPC .......... *H04L 7/0337* (2013.01); *H03L 7/0805* (2013.01); *H03L 7/087* (2013.01)

(58) Field of Classification Search
CPC ...... H04L 7/0337; H03L 7/0805; H03L 7/087
See application file for complete search history.

(56) References Cited

U.S. PATENT DOCUMENTS

| 6,259,755 B1 | 7/2001 | O'Sullivan et al. |
| 7,522,686 B2 | 4/2009 | Nam et al. |
| 8,804,888 B2 | 8/2014 | Mohajeri et al. |
| 9,419,786 B2 | 8/2016 | Lin et al. |
| 2004/0141567 A1 | 7/2004 | Yang et al. |
| 2011/0285438 A1* | 11/2011 | Kinugasa ............... H03L 7/087 327/157 |
| 2013/0070835 A1 | 3/2013 | Sindalovsky et al. |

FOREIGN PATENT DOCUMENTS

KR 10-1706196 B1 2/2017

OTHER PUBLICATIONS

EPO Partial Search Report dated Feb. 11, 2020, for corresponding European Patent Application No. 19194481.8 (12 pages).

* cited by examiner

*Primary Examiner* — Kabir A Timory
(74) *Attorney, Agent, or Firm* — Lewis Roca Rothgerber Christie LLP

(57) ABSTRACT

A system and method for a frequency detector circuit includes: a transition detector configured to receive a data input and provide a first edge output based on transitions in the data input; a first circuit configured to generate a second edge output; a second circuit configured to generate a third edge output; and a combinational logic configured to output an UP output when at least two of the first edge output, the second edge output, and the third edge output are high and configured to output a DOWN output when the first edge output, the second edge output, and the third edge output are all low.

5 Claims, 11 Drawing Sheets

| Dodd | Xodd | Deven | edge1 Odd | edge0 Odd | Freq. detector | | Phase detector | |
|---|---|---|---|---|---|---|---|---|
| | | | | | UP Odd | DN Odd | UP Odd | DN Odd |
| 0 | 0 | 0 | 0 | 0 | 0 | 1 | 0 | 0 |
| 0 | 0 | 1 | 0 | 1 | 0 | 0 | 0 | 1 |
| 0 | 1 | 0 | 1 | 1 | 1 | 0 | 0 | 0 |
| 0 | 1 | 1 | 1 | 0 | 0 | 0 | 1 | 0 |
| 1 | 0 | 0 | 1 | 0 | 0 | 0 | 1 | 0 |
| 1 | 0 | 1 | 0 | 1 | 1 | 0 | 0 | 0 |
| 1 | 1 | 0 | 0 | 1 | 0 | 0 | 0 | 1 |
| 1 | 1 | 1 | 0 | 0 | 0 | 1 | 0 | 0 |

EFFICIENT FREQUENCY DETECTORS FOR CLOCK AND DATA RECOVERY CIRCUITS

CROSS-REFERENCE TO RELATED APPLICATION

The present application claims priority to, and the benefit of, U.S. Provisional Patent Application No. 62/732,942, entitled EFFICIENT FREQUENCY DETECTORS FOR CLOCK AND DATA RECOVERY CIRCUITS, filed on Sep. 18, 2018, the contents of which are incorporated herein by reference in its entirety.

BACKGROUND

Some embodiments of the present disclosure relate generally to frequency acquisition and bang-bang phase detectors used in clock and data recovery (CDR).

Serial links include a transmitter connected to a receiver via a channel. The receiver generally includes a circuit configured to generate a clock that aligns with the phase of the incoming data.

FIG. 1 depicts a related art CDR circuit configured to align a locally generated clock with an incoming data signal.

Referring to FIG. 1, a related art CDR system 100 includes data and crossing slicers 110 that sample the incoming data and provide the data to the bang-bang phase detector 120. The bang-bang phase detector 120 determines if the phase of the clock generated by a voltage controlled oscillator (VCO) 130 is in alignment (e.g., in-phase) with the incoming data. A bang-bang phase detector has 3 states that include the phase being early, late, or that there is no useful information (e.g., there is no data transition required to determine phase alignment). Based on the current state, the bang-bang phase detector 120 outputs an up value or a down value. The up and down signals are provided to a charge pump 140 which activates a switch to increase or decrease the control voltage of the VCO 130. For example, when an up signal is received at the charge pump 140, the charge pump increases the control voltage of the VCO 130 and the frequency of the clock generated is increased. Similarly, when a down signal is received at the charge pump 140, the charge pump 140 decreases the control voltage of the VCO 130 and the frequency of the clock generated is decreased.

In order to properly lock the phase, the VCO 130 needs to generate a clock with a frequency close to the data rate. Thus, frequency acquisition 150 is used to set the initial clock. The frequency acquisition circuit 150 receives a clock output from the VCO 130 and provides a voltage output to increase or decrease the clock frequency generated by the VCO 130.

In the past, a number of methodologies have been employed for frequency acquisition. For example, frequency acquisition has been performed using a frequency acquisition circuit that may employ a phase-frequency detector (PFD), a rotational frequency detector, or a counter-based frequency detector. These prior systems, however, have suffered from numerous disadvantages. For example, a PFD is not suitable for digital CDR. Both PFDs and rotational frequency detectors do not work well with low-swing signals transmitted from the transmitter. Counter-based frequency detectors need multi-bit counters and various arithmetic operations to function requiring too much space and complexity and furthermore may produce a multi-bit frequency error and are therefore difficult to implement.

Thus, a method of providing accurate frequency acquisition that operates on input data after translation to CMOS (e.g., after the slicers) and without the use of multi-bit arithmetic operations is needed.

The above information is only for enhancement of understanding of the background of embodiments of the present disclosure, and therefore may contain information that does not form the prior art.

SUMMARY

Some embodiments of the present disclosure provide a system and method for a frequency detector circuit. In various embodiments, the frequency detector circuit includes: a transition detector configured to receive a data input and provide a first edge output based on transitions in the data input; a first circuit configured to generate a second edge output; a second circuit configured to generate a third edge output; and a combinational logic. In various embodiments, the combinational logic is configured to: output an UP output when at least two of the first edge output, the second edge output, and the third edge output are high; and output a DOWN output when the first edge output, the second edge output, and the third edge output are all low.

In various embodiments, the first circuit includes a first delay circuit and the second circuit includes a second delay circuit.

In various embodiments, the combinational logic includes a DOWN logic and an UP logic.

In various embodiments, the DOWN logic includes: an AND gate having a first input, a second input, and a third input; a first inverter configured to receive the first edge output and connected to the first input; a second inverter configured to receive the second edge output and connected to the second input; and a third inverter configured to receive the third edge output and connected to the third input.

In various embodiments, the UP logic includes: a three input OR gate; a first AND gate configured to receive the first edge output and the second edge output and provide a first output to a first input of the three input OR gate; a second AND gate configured to receive the first edge output and the third edge output and provide a second output to a second input of the three input OR gate; and a third AND gate configured to receive the second edge output and the third edge output and provide a third output to a third input of the three input OR gate.

In various embodiments, the combinational logic further includes a selection circuit configured to convert the operation of the frequency detector to a phase detector according to a selection signal.

In various embodiments, a method of frequency detection includes: sampling a data input to obtain an odd data sample of the input data (Dodd); sampling the data input to obtain an odd crossing sample of the input data (Xodd); sampling the data input to obtain an even data sample of the input data (Deven); sampling the data input to obtain an even crossing sample of the input data (Xeven); generating an UP odd signal according to Dodd, Xodd, and Deven; generating a DOWN odd signal according to Dodd, Xodd, and Deven; generating an UP even signal according to Deven, Xeven, and Dodd; and generating a DOWN even signal according to Deven, Xeven, and Dodd.

In various embodiments, generating an UP odd signal according to Dodd, Xodd, and Deven includes: determining an odd first edge signal according to the Dodd and Xodd, wherein the odd first edge signal is high when Dodd and Xodd have different values; determining an odd second edge signal according to the Xodd and Deven, wherein the odd second edge signal is high when Xodd and Deven have different values; and outputting the UP odd signal when the odd first edge signal and the odd second edge signal are both high.

In various embodiments, generating a DOWN odd signal according to the Dodd, Xodd, and Deven includes: determining an odd first edge signal according to Dodd and Xodd, wherein the odd first edge is high when Dodd and Xodd have different values; determining an odd second edge signal according to Xodd and Deven, wherein the odd second edge is high when Xodd and Deven have different values; and outputting the DOWN odd signal when the odd first edge signal and the odd second edge signal are both low.

In various embodiments, generating an UP even signal according Deven, Xeven, and Dodd includes: determining an even first edge signal according to Deven and Xeven, wherein the even first edge signal is high when Deven and Xeven have different values; determining an even second edge signal according to Xeven and Dodd, wherein the even second edge signal is high when Xeven and Dodd have different values; and outputting the UP even signal when the even first edge signal and the even second edge signal are both high.

In various embodiments, generating a DOWN even signal according to Deven, Xeven, and Dodd includes: determining an even first edge signal according to Deven and Xeven, wherein the even first edge signal is high when Deven and Xeven have different values; determining an even second edge signal according to Xeven and Dodd, wherein the even second edge signal is high when Xeven and Dodd have different values; and outputting the DOWN even signal when the even first edge signal and the even second edge signal are both LOW.

In various embodiments, the method further includes temporally aligning the Dodd, Xodd, and Deven.

In various embodiments, the method further includes temporally aligning Deven, Xeven, and Dodd.

In various embodiments, the method further includes providing a mode selection signal to engage a frequency detection mode.

In various embodiments, a phase/frequency detector circuit includes a first slicer configured to sample a data input according to a first clock and output an odd data sample (Dodd); a second slicer configured to sample the data input according to a second clock and output an odd crossing sample (Xodd); a third slicer configured to sample the data input according to a third clock and output an even data sample (Deven); a fourth slicer configured to sample the data input according to a fourth clock and output an even crossing sample (Xeven); a first data alignment circuit configured to temporally align the Dodd, Xodd, and Deven; a second data alignment circuit configured to temporally align the Deven, Xeven, and Dodd; and a combinational logic circuit. In various embodiments, the combinational logic circuit is configured to: generate a first edge output according to Dodd and Xodd; generate a second edge output according to Xodd and Deven; generate a third edge output according to Deven and Xeven; generate a forth edge output according to Xeven and Dodd; generate an UP odd signal when the first edge output and the second edge output are both high; generate a DOWN odd signal when the second edge output and the second edge output are both low; generate a UP even signal when the third edge output and the fourth edge output are both high; and generate a DOWN even signal when the third edge output and the fourth edge output are both low.

In various embodiments, the combinational logic further includes a selection circuit configured to switch the operation of the combinational logic between a phase detection mode and a frequency detection mode according to a selection signal.

In various embodiments, the selection circuit is configured to invert the value of the second edge output and the forth edge output when the selection signal designates the phase detection mode.

In various embodiments, the selection circuit includes a first exclusive OR (XOR) gate configured to receive the second edge output and the selection signal and a second XOR gate configured to receive the fourth edge output and the selection signal.

In various embodiments, the selection circuit is configured to invert Deven and Dodd according to the selection signal.

In various embodiments, the selection circuit includes a first exclusive OR (XOR) gate configured to receive the Deven and the selection signal and a second XOR gate configured to receive Dodd and the selection signal.

BRIEF DESCRIPTION OF THE DRAWINGS

Some embodiments can be understood in more detail from the following description taken in conjunction with the accompanying drawings, in which:

FIG. 11 depicts a truth table showing the combined BBPD/frequency detector system output for odd data according to various embodiments.

DETAILED DESCRIPTION

Figure 1:
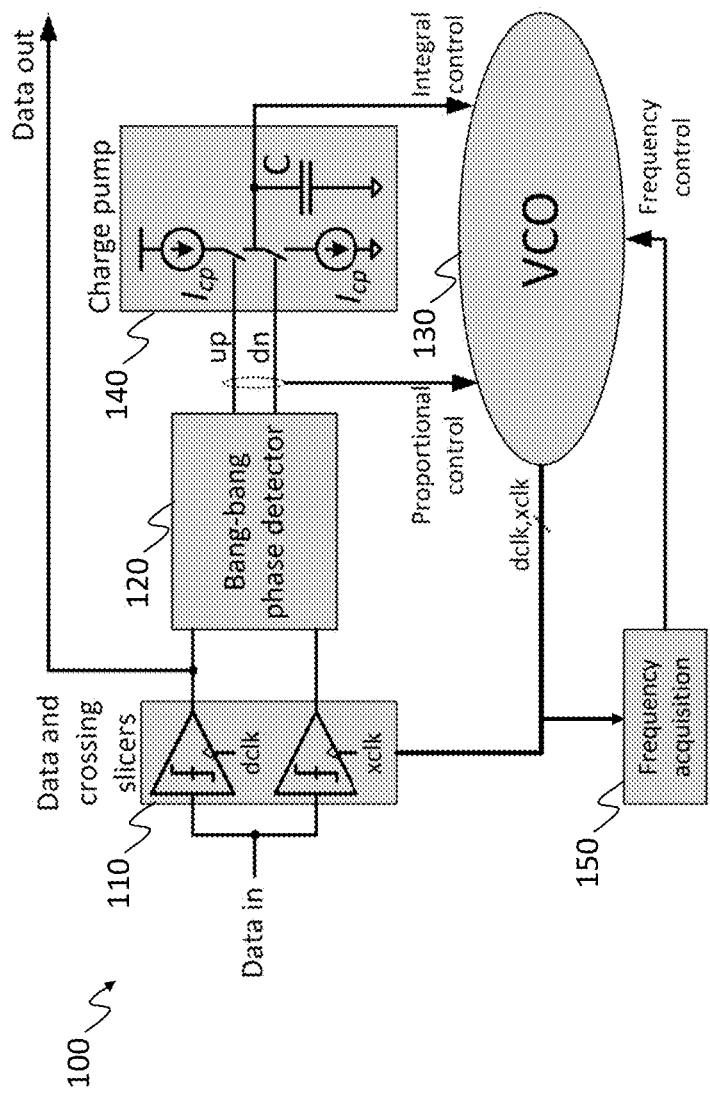
FIG. 1 depicts a related art CDR.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

Embodiments of the present disclosure include a system and method for an efficient frequency detector in a clock and data recovery (CDR) circuit. In various embodiments, the system and method allows for the detection of an input reference frequency and the comparison with a local clock (e.g., one or more oscillator frequencies). For example, in some embodiments, a transmitter may periodically supply a training pattern to the receiver. The training pattern is sampled by one or more slicers operating in accordance with the local clock. In various embodiments, an efficient frequency detector may be configured to detect signal edges and utilize combinational logic and prior edges to provide an output UP or DOWN signal indicating the need to increase or decrease the local clock speed.

Figure 2A:
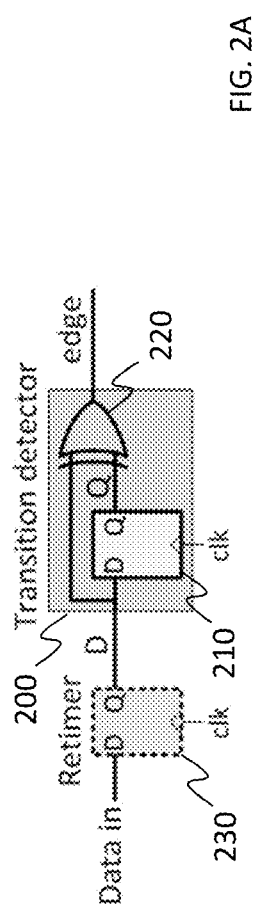
FIG. 2A depicts an example transition detector according to various embodiments.
Figure 2B:
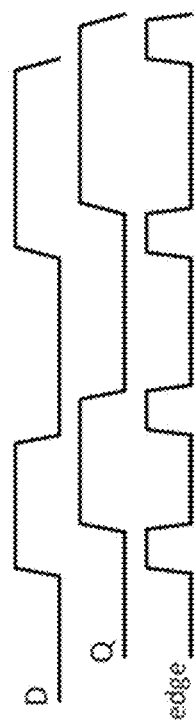
FIG. 2B includes a timing diagram for the transition detector of FIG. 2B according to various embodiments

FIG. 2A depicts an example transition detector according to various embodiments. FIG. 2B includes a timing diagram for the transition detector of FIG. 2B according to various embodiments.

Referring to FIGS. 2A and 2B in various embodiments, a transition detector 200 may be used to determine when the incoming data signal has a transition from low-to-high (e.g., from logical low to logical high) or high-to-low (e.g., logical high to logical low). In various embodiments, the transition detector 200 may include a d-flip flop 210, an exclusive OR (XOR) 220 and a retimer 230. In various embodiments, the d-flip flop 210 receives the data signal D and outputs a delayed data signal Q. For example, the delayed data signal Q of the d-flip flop 210 may be delayed by a clock cycle, a half clock cycle, a quarter clock cycle etc.

In some embodiments, a retimer 230 may be configured to receive an incoming data signal (e.g., from a slicer) and synchronize the incoming data signal with the local clock. For example, the retimer 230 may also include a d-flip flop that operates according to the local clock. Since the transition detector 200 also operates according to the local clock, and the local clock may not be synchronized with the data being received, the retimer 230 allows for the logic in the transition detector 200 to operate accurately.

In various embodiments, an edge (e.g. transition in the data signal) is detected by the XOR 220 comparing the current data signal D and the delayed data signal Q. For example, referring to FIG. 2B, a first edge may be detected when D transitions from low to high and a second edge may be detected when D transitions from high to low and so on.

Figure 3:
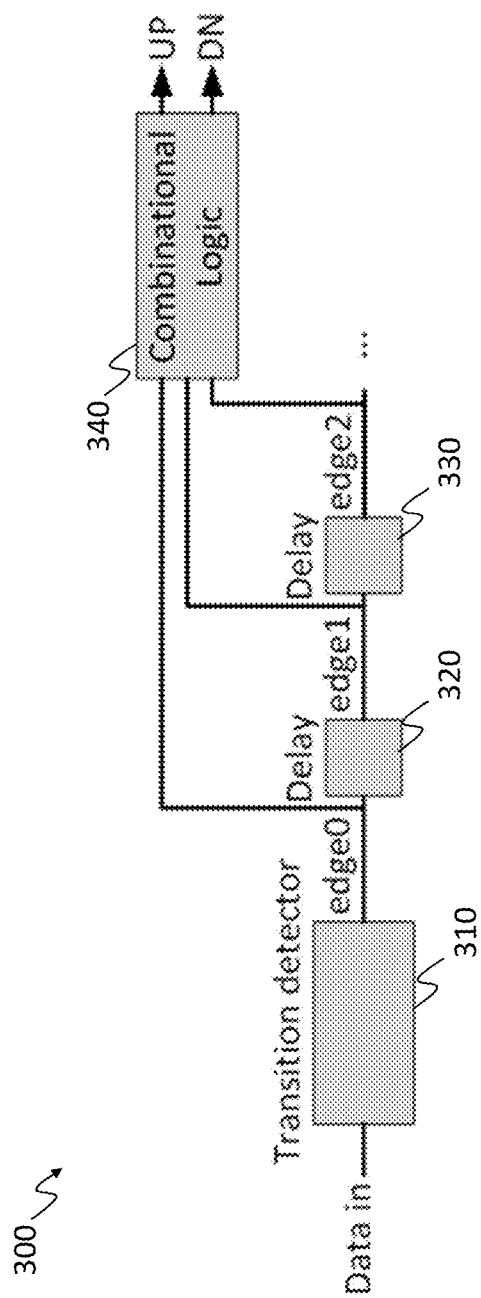
FIG. 3 depicts a frequency detector according to various embodiments.

FIG. 3 depicts a frequency detector according to various embodiments.

Referring to FIG. 3, in various embodiments the frequency detector 300 is configured to detect the frequency of the incoming data signal based on the number of edges that have occurred in recent history. In various embodiments, the frequency detector 300 includes a transition detector 310, a delay circuit 320, a delay circuit 330, and combinational logic 340.

In various embodiments, the first and second delay circuits 320, 330 may be delay circuits that are configured to provide a one clock cycle delay, however, in some embodiments, the first and second delay circuits 320, 330 may be configured to provide half or quarter clock cycle delays. For example, in various embodiments, the first and second delay circuits 320, 330 may be d-flip flops, however, in other embodiments, other delay circuits may be utilized. In various other embodiments, delay circuits may not be necessary. For example, as will be discussed below, in some embodiments, signals sampled by multiple phase-shifted clocks may be used in lieu of delay circuits.

In various embodiments, the combinational logic 340 is configured to receive the output of the transition detector 310 (edge 0), a first delayed edge from the first delay circuit 320 (edge 1), and a second delayed edge from the second delay circuit 330 (edge 2). For example, the first delay circuit 320 receives the current output of the transition detector 310 and outputs the previous output (e.g., the output from 1 clock cycle ago) of the transition detector 310. Similarly, the second delay circuit 330 receives the output from the first delay circuit 320 (e.g., the output of the transition detector from 1 clock cycle ago) and outputs the previous output of the first delay circuit 320 (e.g., the output of the transition detector from 2 clock cycles ago). Each of the transition detector 310, first delay circuit 320, and second delay circuit 330 may operate according to a local clock (e.g., from a voltage controlled oscillator).

In various embodiments, the combinational logic 340 may utilize these inputs and using single bit logic functions generate UP and DOWN outputs indicative of whether the currently generated frequency is lower or higher than the target. In various embodiments, the UP and DOWN outputs may indicate that the current clock is correct, sampling data too fast, or sampling data too slow. For example, when the current clock is correct, the combinational logic 340 may provide no output. When the current clock is sampling the data too quickly, the combinational logic supplies a DOWN output. Conversely, when the current clock is sampling the data too slowly, the combinational logic 340 generates an UP output. Thus, the frequency error may be encoded as an average of 1-bit UP/DOWN streams.

Figure 4A:
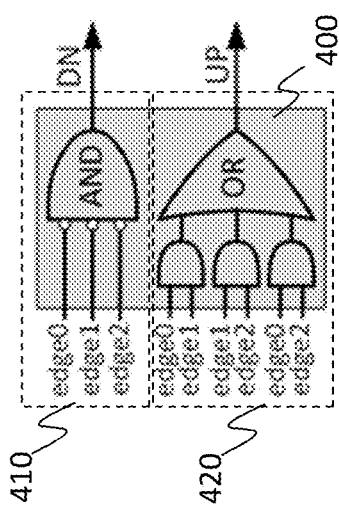
FIG. 4A depicts an example embodiment of combinational logic for frequency detection according to various embodiments.
Figure 4B:
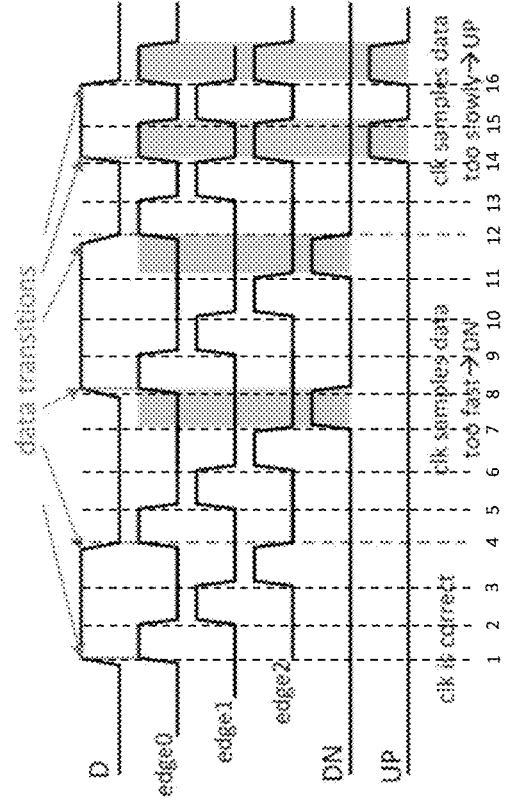
FIG. 4B depicts a timing diagram of the operation of the combinational logic of FIG. 4A when used in the frequency detector according to various embodiments

FIG. 4A depicts an example embodiment of combinational logic for frequency detection according to various embodiments. FIG. 4B depicts a timing diagram of the operation of the combinational logic of FIG. 4A when used in the frequency detector according to various embodiments.

Referring to FIGS. 4A and 4B, in various embodiments, the combinational logic 400 may be configured to determine when the locally generated clock is operating at the correct speed. For example, a transmitter may send a training pattern for use in setting the local clock. In various embodiments, the training pattern may be six clock cycles in length. In some embodiments, the training pattern may have a longer or a shorter period.

In various embodiments, the combinational logic 400 may utilize the current transition detector output signal (edge 0), a first delayed signal (edge 1), and a second delayed signal (edge 2) to determine when the locally generated clock is operating at the correct speed. In various embodiments, the combinational logic 400 includes DOWN logic 410 and UP logic 420 for determining when the locally generated clock is operating too fast and too slow. For example, the combinational logic 400 is configured to provide a DOWN output when the local clock is sampling the incoming data stream too quickly (e.g., the clock is too fast) and an UP output when the local clock is sampling the incoming data stream too slowly (e.g., the clock is too slow).

In various embodiments, the DOWN logic 410 may, for example, be configured to determine when none of the input values (edge 0, edge 1, and edge 2) are high. This determination may be made using any combination of digital logic gates. For example, in various embodiments, the DOWN logic 410 includes an AND gate with inverted inputs and is configured to receive edge 0 at a first input, edge 1 at a second input, and edge 2 at a third input. Thus, the AND gate provides a high output when none of edge 0, edge 1, or edge 2 are high. It should be understood that in various embodiments, equivalent logic circuits may be utilized to provide the same output. For example, the inverters and the AND gate may be substituted with a NOR gate or other logic gates to provide equivalent functionality.

In various embodiments, the UP logic 420 may, for example, be configured to determine when at least two of the input values (edge 0, edge 1, and edge 2) are high. In various embodiments, the UP logic includes a first AND gate, a second AND gate, a third AND gate, and an OR gate. In these embodiments, the first AND gate receives edge 0 and edge 1, the second AND gate receives edge 1 and edge 2, and the third AND gate receives edge 0 and edge 2. The output of each AND gate is then provided to the OR gate. Thus, if two of the three input values are high, then the UP logic 420 will provide a high output (e.g., an UP output).

Referring to FIG. 4B, a timing diagram showing the operation of the combinational logic 400 according to various embodiments is depicted. In various embodiments, the frequency detector may be supplied with a data signal that is a training signal. For example, a transmitting device may periodically send a training signal or pattern to help sync the clock in the receiver. In some embodiments, the training signal may be sent during an initialization period and in some embodiments, the training signal may be sent periodically. For example, in the context of a display, a training signal may be sent with each new frame of display data. In the depicted example, the received training signal D is shown as having a plurality low and high outputs with varying lengths of time, however, the training signal may be any signal configured for performing frequency detection. For example, the training pattern may be a periodic sequence of 0s and 1s configured for the frequency detector. In various embodiments, the frequency detector of FIG. 4A may have a training pattern of 000000111111, while the training pattern used for the frequency detector described with below may have a training pattern of 010101010101.

As shown in FIG. 4B, the first data transition causes the value of edge 0 to transition to a high value for one clock cycle. The value of edge 1 is the value of edge 0 in the previous clock cycle. Thus, the value of edge 1 transitions to a high value a clock cycle (e.g., the local clock) after the edge 0 transitions to high. Similarly, the value of edge 2 is the value of edge 0 from two cycles ago (and the value of edge 1 from one cycle ago). Thus, the value of edge 2 transitions from low to high a clock cycle after the value of edge 1 transitions to high (and two clock cycles after edge 0 transitioned to high). At the seventh clock cycle, edge 0 is low, edge 1 is low, and edge 2 is low. Thus, a DOWN output is provided by the DOWN logic 410 indicating that the local clock is sampling the data too quickly. Similarly, at the eleventh clock cycle, the values of edge 0, edge 1, and edge 2 are all low. Thus, another DOWN output is provided by the DOWN logic 410. At the fourteenth clock cycle, edge 0 and edge 2 are both high, thus the UP logic 420 provides an UP output signaling that the local clock is causing the input data to be sampled too slowly. Similarly, at the sixteenth clock cycle, the value of edge 0 and edge 2 are again high and the UP logic 420 provides another UP signal.

Figure 5A:
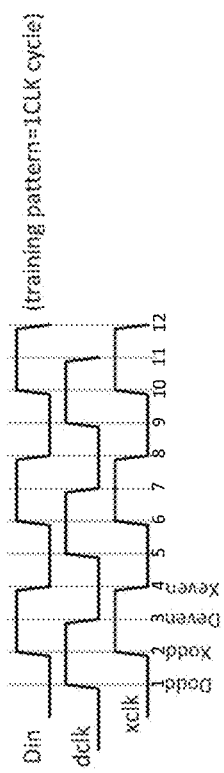
FIG. 5A depicts an example data input and a locally generated a data clock (dclk), and a locally generated crossing clock (xclk)
Figure 5B:
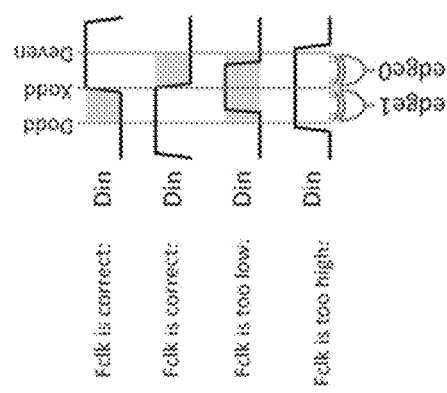
FIG. 5B illustrates an embodiment of combinational logic used by a frequency detector.

FIG. 5A depicts an example data input and a locally generated a data clock (dclk), and a locally generated crossing clock (xclk). FIG. 5B illustrates an embodiment of combinational logic used by a frequency detector.

Referring to FIG. 5A, in various embodiments, the data clock may lead the crossing clock by a quarter clock cycle. In various embodiments, the odd and even numbered edges of the data clock and the crossing clock may be used by the frequency detector. In various embodiments, a frequency detector may be configured to operate according to a training pattern of 010101010101 with a period equal to one clock cycle.

Input data may be sampled according to transitions in the data and crossing clocks. For example, the input data may be sampled at the first transition (e.g., the up or positive transition) of the data clock (dclk) and the data sample is labeled as Dodd, the input data sampled at the first transition (e.g., the up or positive transition) of the crossing clock is labeled as Xodd, the input data sampled at the second transition (e.g., the down or negative transition) of the data clock (dclk) is labeled as Deven, and the input data sampled at the second transition (e.g., the down or negative transition) of the crossing clock (xclk) is labeled Xeven. Stated differently, the odd numbered edges may be up transitions and the even numbered edges may be down transitions.

Referring to FIG. 5B, in various embodiments the combinational logic may be configured to determine if the local clock frequency is correct by determining edge0 and edge1 using the odd and even transitions and then applying further logic. For example, edge1 may be equal to Dodd XOR Xodd and edge0 may be equal to Xodd XOR Deven. The edge signals (edge 0 and edge 1) may be utilized to generate UP and DOWN values. For example, in various embodiments, an UP or a DOWN output is provided when the value of the edge signals is the same. For example, when both edge 0 and edge 1 are logically zero, the locally generated clock is operating too fast (e.g., too high) and a DOWN signal is generated. Similarly, when edge 0 and edge 1 are logically one, the locally generate clock is operating too slow (e.g., too low) and an UP signal may be generated.

Figure 6:
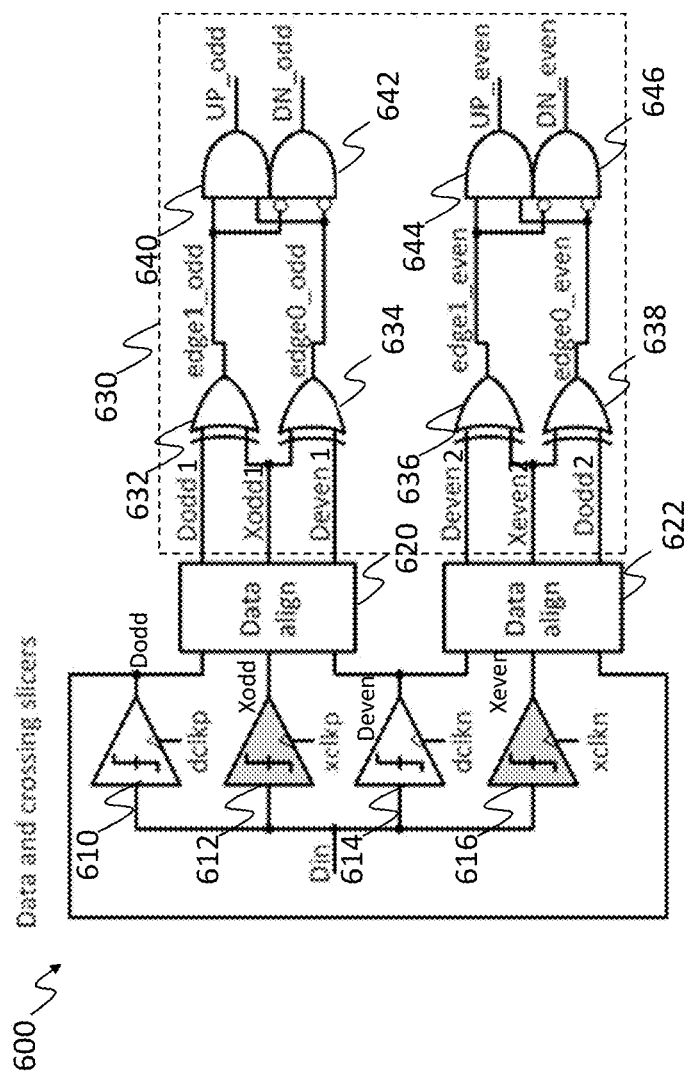
FIG. 6 depicts a frequency detector according to various embodiments.

FIG. 6 depicts a frequency detector according to various embodiments.

Referring to FIG. 6, in various embodiments a frequency detector 600 may be configured to utilize a training pattern with a period equal to one system clock cycle. In various embodiments, the input data Din may be sampled using four clocks that include a first data clock dclkp, a second data clock dclkn, a first crossing clock xclkp, and a second crossing clock xclkn. In various embodiments, each of the clocks may be spaced 90 degrees apart. For example, in some embodiments, dclkp may correspond to a positive transition of a dclk and dclkn may correspond to a negative transition of a dclk. Similarly, xclkp may correspond to a positive transition of the xclk and xclkn may correspond to a negative transition of the xclk. In various embodiments, the frequency detector 600 may be connected to one or more data slicers 610-616 for sampling the input data signal Din. For example, the data slicers 610-616 are configured to receive the input data stream and operate according to one of the local clocks. For example, a first data slicer 610 may operate according to the first data clock (dclkp), a second data slicer 612 may operate according to the first crossing clock (xclkp), a third data slicer 614 may operate according to the second data clock (dclkn), and the fourth data slicer 616 may operate according to the second crossing clock (xclkn). In various embodiments, the first data slicer 610 may be configured to sample data according to the rising edge of dclkp and output Dodd, the second data slicer 612 may be configured to sample data according to the rising edge of xclkp and output Xodd, the third data slicer 614 may be configured to sample data according to the rising edge of dclkn and output Deven, and the forth data slicer 616 may be configured to sample data according to the rising edge of xclkn and output Xeven.

As discussed above, the clocks are each spaced 90 degrees apart. For example, in various embodiments, Dodd may be a quarter cycle (e.g., 90 degrees) ahead of Xodd which is a quarter cycle ahead of Deven. Thus, the alignment circuit 620 may delay Dodd by a half cycle and Xodd by a quarter cycle to bring them into alignment with Deven. Similarly, the alignment circuit 622 may delay Deven by half a cycle and Xeven by a quarter cycle to bring them in alignment with Dodd.

In various embodiments, the sampled and aligned data (Dodd, Xodd, Deven, Xeven) may be supplied to combinational logic 630. In various embodiments, the combinational logic 630 is configured to generate even and odd UP and DOWN signals. For example, similar to the embodiment described with reference to FIGS. 5A and 5B, the combinational logic 530 may be configured to determine when two neighboring data samples are the same. For example, the combinational logic 630 may determine when the value of the input data stream Din is the same for two consecutive edges have the same value to generate the edge signals (e.g., edge 0 even/odd and edge 1 even/odd) and then compare the edges to determine if the local clock should be adjusted.

In various embodiments, the combinational logic 630 includes a first XOR 632, a second XOR 634, a third XOR 636, a fourth XOR 638, a first AND 640, a second AND 642, a third AND 644, and a forth AND 646. In various embodiments, the first XOR 632 receives Dodd1 and Xodd1 and outputs edge 1 odd, the second XOR 634 receives Xodd1 and Deven1 and outputs edge 0 odd, the third XOR 636 receives Deven2 and Xeven2 and outputs edge1 even, and the forth XOR 638 receives Xeven2 and Dodd2 and outputs edge 0 even. In various embodiments, AND gates are configured to determine when edge 0 and edge 1 are both logic high or both logic low. For example, if edge 0 and 1 are both high, an UP output is generated. Conversely, when edge 0 and 1 are both low, a DOWN output is generated. In various embodiments, the first AND 640 receives edge 1 odd and edge 0 odd and outputs UP odd, and the second AND 642 receives inverted edge 1 odd and inverted edge 0 odd and outputs DOWN odd. Similarly, the third AND 644 receives edge 1 even and edge 0 even and outputs UP even, and the forth AND 646 receives inverted edge 1 even and inverted edge 0 even and outputs DOWN even. As discussed above, XOR and AND gates may be substituted for any functionally equivalent logic gates.

Figure 7:
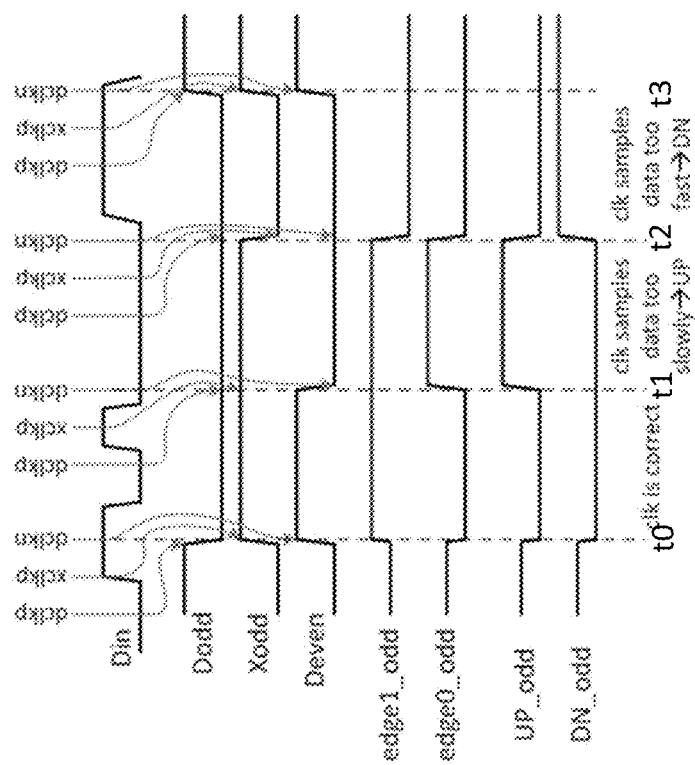
FIG. 7 depicts a timing diagram for an odd slice and the operation of a frequency detector according to various embodiments.

FIG. 7 depicts a timing diagram for an odd slice and the operation of a frequency detector according to various embodiments.

Referring to FIG. 7, in various embodiments, a frequency detector may receive a data signal Din containing a training pattern. In this example, the values for an odd slice are depicted. Thus, Dodd, Xodd, and Deven are used as inputs for determining edge1 odd and edge0 odd and subsequently UP odd and DOWN odd. In various embodiments, Dodd is sampled according to dclkp, Xodd is sampled according to xclkp, and Deven is sampled according to dclkn. As described above, dclkp, xclkp, and dclkn (and not depicted xclkn) may be 90 degrees out of phase. In this embodiment, dclkp causes the first slicer 610 to sample the input data stream Din first, xclkp causes the second slicer 612 to sample the input data stream Din second, and dclkn causes the third slicer 614 to sample the input data stream Din third. Data alignment 620 may then be used to bring Dodd1, Xodd1, and Deven1 into alignment for further processing.

In this example, at the first time t0, Dodd is low because dclkp causes the first slicer 610 to sample the data stream Din while Din is low. Similarly, Xodd and Deven both transition to high because xclkp causes the second slicer 612 to sample Din while Din is high and dclkn similarly causes the third slicer 614 to sample Din while the value of Din is high. Thus, edge 1 odd transitions to high and edge 0 odd transitions to low (e.g., because edge 1 odd equals Dodd XOR Xodd and edge 0 odd equals Xodd XOR Deven). Since edge 1 odd is high and edge 0 odd is low, no frequency error is detected, and the output of UP odd and DOWN odd are both low, indicating, that the local clock has a correct frequency for the input data stream Din.

In various embodiments, the local clock may be too slow and is therefore sampling the input data stream too slowly. For example, at t1, Dodd is low because dclkp causes the first slicer 610 to sample the data stream Din while Din is low. Similarly, Xodd is high because xlckp causes the second slicer 612 to sample the data stream Din while Din is high. In this example, Deven is also low because dclkn causes the third slicer 614 to sample the data stream Din while Din is low. Thus, in various embodiments, the values for edge 1 odd and edge 0 odd may both be high and an UP odd signal may be output to increase the local clock speed. Conversely, in various embodiments, the local clock may be too fast and the system is therefore sampling the input data stream too quickly. For example, at t2, edge 1 odd and edge 0 odd are both low because Dodd, Xodd, and Deven are each low, resulting in a DOWN signal. Similarly, at t3, DOWN odd may again be high because edge 1 odd and edge 0 odd are again low. The lack of data transitions as observed at t2 and t3 indicates that clock frequency is too fast compared to the training pattern on Din.

Figure 8:
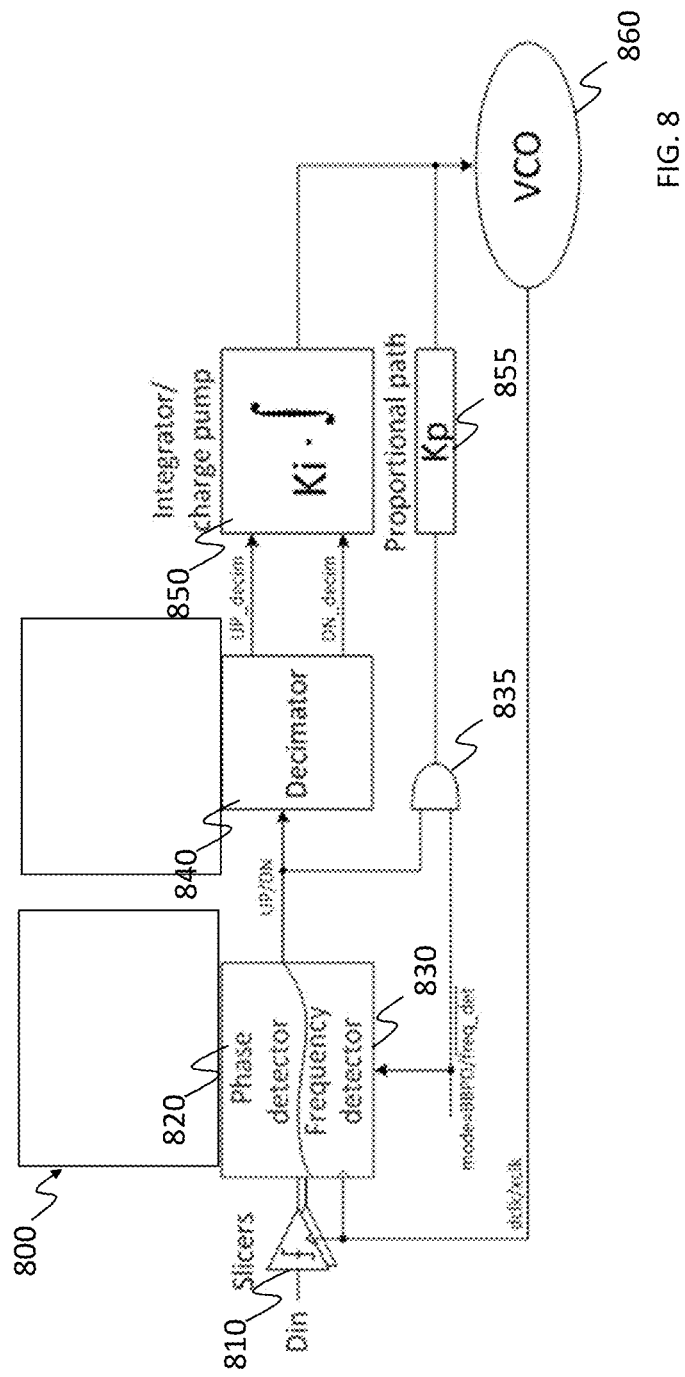
FIG. 8 depicts an example clock and data recover circuit having a frequency detector integrated with a bang bang phase detector (BBPD) according to various embodiments.

FIG. 8 depicts an example clock and data recover circuit having a frequency detector integrated with a bang bang phase detector (BBPD) according to various embodiments.

Referring to FIG. 8, in various embodiments, a clock and data recovery circuit 800 may include a frequency detector 830 that is integrated with a bang bang phase detector 820. In various embodiments, the frequency detector 830 may operate similarly to a bang bang phase detector 820. For example, the bang bang phase detector 820 and the frequency detector 830 may each be connected to one or more slicers 810 operating according to a local clock (e.g., the slicers 610-616 described above with reference to FIG. 6). In various embodiments, the BBPD 820 and the frequency detector 830 may operate according to edge 0 and edge 1.

In various embodiments, the BBPD 820 may operate such that when edge 0 and edge 1 are both low, the BBPD 820 provides no output. The BBPD 820 may output a DOWN when edge 1 is low and edge 0 is high. Conversely, the BBPD 820 may output an UP when edge 1 is high and edge 0 is low. Thus, in various embodiments, the frequency detector 830 operates in the same manner as the BBPD 820 if edge 0 is inverted.

In various embodiments, the clock and data recovery circuit 800 may include a phase/frequency selection circuit

835. For example, in various embodiments, the phase/frequency selection circuit 835 may include an AND gate configured to receive a mode selection signal. The mode selection signal disables a proportional control path in a frequency acquisition mode. For example, when the mode selection signal is LOW (indicating frequency acquisition mode), the output of frequency detector only drives the integrator 850, while when the mode selection signal is HIGH (indicating phase acquisition/tracking mode), the output of phase/frequency detection selection circuit 835 tracks the output of BBPD 820, thereby also activating a proportional control path 855. This allows for the clock and data recovery circuit 800 to be set as operating in a frequency acquisition mode (e.g., operating using the frequency detector 830) or in a phase acquisition/tracking mode (e.g,, operating using the BBPD 820).

In various embodiments, the clock and data recovery circuit 800 may include a decimator 840 used in conjunction with the integrator 850 (e.g., a charge pump) to provide an adjustment voltage to the VCO 860 during BBPD operation.

Figure 9:
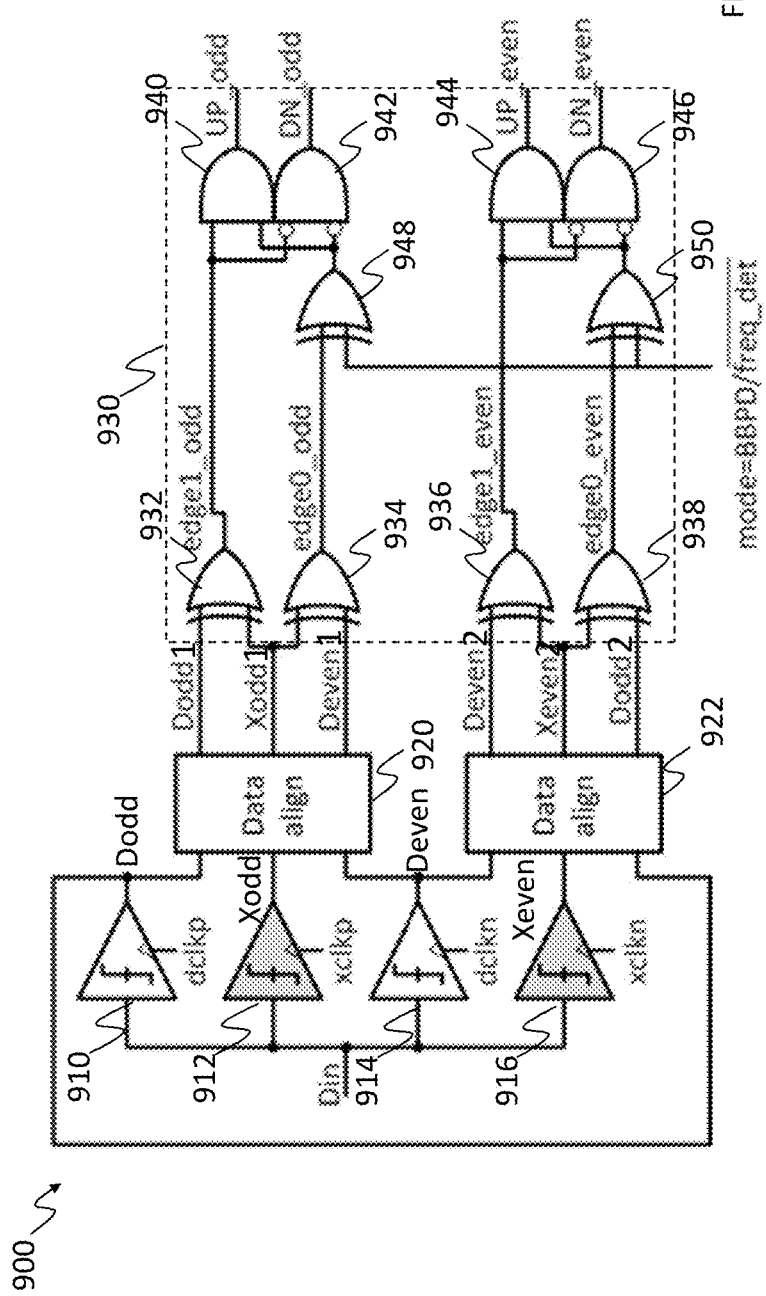
FIG. 9 depicts an example combination bang bang phase detector and frequency detector according to various embodiments.

FIG. 9 depicts an example combination bang bang phase detector and frequency detector according to various embodiments.

Referring to FIG. 9, in various embodiments, a combination BBPD/frequency detector 900 may switch between a frequency detection mode and a phase detection mode according to a mode selection signal. In various embodiments, the mode selection signal may be configured to toggle XOR gates to select when the combination BBPD/frequency detector 900 is operating as a BBPD or a frequency detector. For example, the combination BBPD/frequency detector 900 includes many of the same or similar components as the frequency detector circuit 600 discussed above. For example, the combination BBPD/frequency detector 900 includes slicers 910-916 operating according to the clocks dclkp, xclkp, dclkn, and xclkn. In various embodiments, data alignment circuits 920, 922 bring the outputs of the slicers 910-916 into phase alignment.

In various embodiments, the combinational logic 930 is configured to generate even and odd UP and DOWN signals during both phase detection and frequency detection modes. For example, similar to the embodiment described with reference to FIG. 6, the combinational logic 930 may be configured to determine when two neighboring Din samples are the same, producing signals edge1_odd/edge1_even and edge0_odd/edge0_even. However, depending on the mode, the value of edge 0 may be inverted. For example, when a BBPD mode is enabled, the value of edge 0 may be inverted (e.g., using an XOR gate). In various embodiments, similar to the embodiment of FIG. 6, the combinational logic 930 includes a first XOR 932, a second XOR 934, a third XOR 936, a fourth XOR 938, a first AND 940, a second AND 942, a third AND 944, and a forth AND 946. In various embodiments, the combinational logic 930 also includes one or more selection circuits 948, 950 for switching operation between BBPD and frequency detection modes according to the mode selection signal. For example, in various embodiments, the selection circuit may include a fifth XOR 948 and a sixth XOR 950, each configured to receive the mode selection signal and invert the edge0 even and odd values accordingly.

For example, in various embodiments, the fifth XOR 948 may receive the edge0_odd signal and the mode selection signal and provide an output to the first AND 940 and the second AND 942. Similarly, the sixth XOR 950 may receive the edge0_even signal and the mode selection signal and provide an output to the third AND 944 and the fourth AND 946. Thus, the mode selection signal may be used to toggle the operation of the BBPD/frequency detector 900 between operating as a BBPD or a frequency detector.

Figure 10:
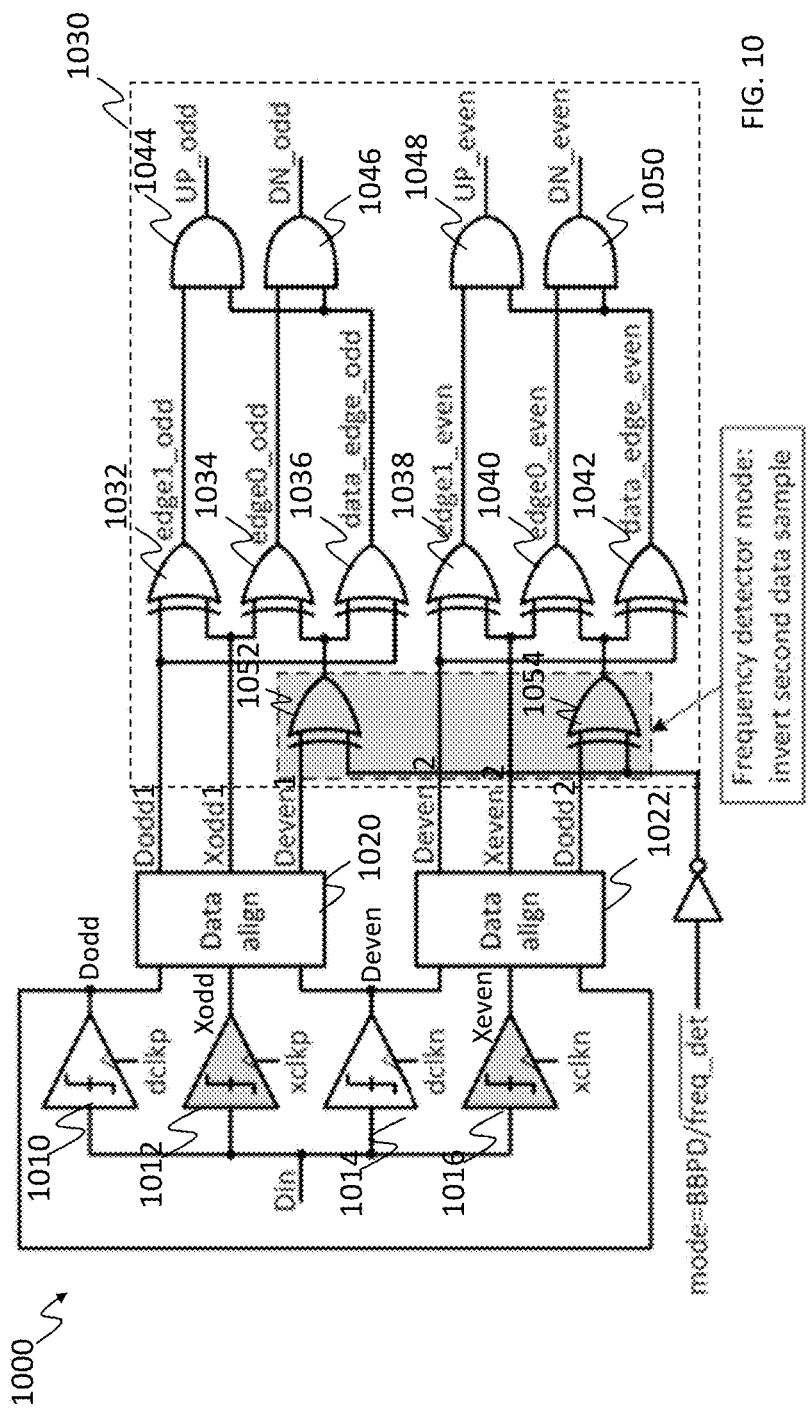
FIG. 10 depicts an example combination bang bang phase detector and frequency detector according to various embodiments.

FIG. 10 depicts an example combination bang bang phase detector and frequency detector according to various embodiments.

Referring to FIG. 10, in various embodiments, a combination BBPD/frequency detector 1000 may switch between a frequency detection mode and a phase detection mode according to a mode selection signal. In various embodiments, the mode selection signal may be configured to toggle XOR gates to select when the combination BBPD/frequency detector 1000 is operating as a BBPD or a frequency detector. For example, the combination BBPD/frequency detector 1000 includes many of the same or similar components as the frequency detector circuit 600 and the combination BBPD/frequency detector 900, each discussed above. For example, the combination BBPD/frequency detector 1000 includes slicers 1010-1016 operating according to the clocks dclkp, xclkp, dclkn, and xclkn. In various embodiments, data alignment circuits 1020, 1022 bring the outputs of the slicers 1010-1016 into phase alignment.

In various embodiments, the combinational logic 1030 is configured to generate even and odd UP and DOWN signals. For example, similar to the embodiment described with reference to FIG. 6, the combinational logic 1030 may be configured to determine when two neighboring Din samples are the same. However, depending on the mode, the values of Deven and Dodd may be inverted before being used by XOR gates 1040, 1042 and 1034, 1036. The seventh XOR 1052 and the eighth XOR 1054 are configured to pass the value of Deven1 and Dodd2 in BBPD mode and invert the value of Deven1 and Dodd2 in frequency detection mode.

In various embodiments, the combinational logic 1030 includes a first XOR 1032, a second XOR 1034, a third XOR 1036, a fourth XOR 1038, a fifth XOR 1040, a sixth XOR 1042, a first AND 1044, a second AND 1046, a third AND 1048, and a forth AND 1050. As discussed above, in various embodiments, the combinational logic 1030 also includes a seventh XOR 1052 and an eighth XOR 1054 configured for switching the operation between BBPD and frequency detection modes according to the mode selection signal.

For example, in various embodiments, the seventh XOR 1052 may receive the Deven1 signal and the mode selection signal (e.g., an inverted mode selection signal) and provide an output to the second XOR 1034 and the third XOR 1036. Similarly, the eighth XOR 1054 may receive the Dodd2 signal and the mode selection signal (e.g., the inverted mode selection signal) and provide an output to the fifth XOR 1040 and the sixth XOR 1042. In various embodiments, the first AND 1044 receives the output of the first XOR 1032 and the third XOR 1036, the second AND 1046 receives the output of the second XOR 1034 and the third XOR 1036, the third AND 1048 receives the output of the fourth XOR 1038 and the sixth XOR 1042, and the fourth AND 1050 receives the output of the fifth XOR 1040 and the sixth XOR 1042.

In various embodiments, the third XOR 1036 is configured to receive the Dodd1 signal and the output of the seventh XOR 1052. The sixth XOR 1042 is configured to receive the Deven2 signal and the output of the eighth XOR 1054.

FIG. 11 depicts a truth table showing the combined BBPD/frequency detector system output for odd data according to various embodiments. It should be understood by those skilled in the art that a comparable truth table for even data may be generated.

Referring to FIG. 11, in various embodiments, the BBPD/frequency detector may be configured to operate in a BBPD mode or a frequency detector mode. In this example, a 1 signifies a logic HIGH output and a 0 signifies a logic LOW output. For example, when operating as a frequency detector, when Dodd, Xodd, and Deven are all zeros, edge 0 and edge 1 will also have values of zero, and a DN output will be equal to 1, i.e. will be asserted. However, when operating as a BBPD, the same inputs would result in DN output being equal to 0.

In the preceding description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A frequency detector circuit comprising:
a transition detector configured to receive a data input and provide a first edge output based on transitions in the data input;
a first circuit configured to generate a second edge output;
a second circuit configured to generate a third edge output; and
a combinational logic configured to:
output an UP output when at least two of the first edge output, the second edge output, and the third edge output are high; and
output a DOWN output when the first edge output, the second edge output, and the third edge output are all low,
wherein the first circuit comprises a first delay circuit and the second circuit comprises a second delay circuit.

2. The frequency detector of claim 1, wherein the combinational logic comprises:
a DOWN logic; and
an UP logic.

3. The frequency detector circuit of claim 1, wherein the combination logic further comprises a selection circuit configured to convert the operation of the frequency detector to a phase detector according to a selection signal.

4. A frequency detector circuit comprising:
a transition detector configured to receive a data input and provide a first edge output based on transitions in the data input;
a first circuit configured to generate a second edge output;
a second circuit configured to generate a third edge output; and
a combinational logic configured to:
output an UP output when at least two of the first edge output, the second edge output, and the third edge output are high; and
output a DOWN output when the first edge output, the second edge output, and the third edge output are all low,
wherein the combinational logic comprises:
a DOWN logic; and
an UP logic, and
wherein the DOWN logic comprises:
an AND gate having a first input, a second input, and a third input;
a first inverter configured to receive the first edge output and connected to the first input;
a second inverter configured to receive the second edge output and connected to the second input; and
a third inverter configured to receive the third edge output and connected to the third input.

5. A frequency detector circuit comprising:
a transition detector configured to receive a data input and provide a first edge output based on transitions in the data input;
a first circuit configured to generate a second edge output;
a second circuit configured to generate a third edge output; and
a combinational logic configured to:
output an UP output when at least two of the first edge output, the second edge output, and the third edge output are high; and
output a DOWN output when the first edge output, the second edge output, and the third edge output are all low,
wherein the combinational logic comprises:
a DOWN logic; and
an UP logic, and
wherein the UP logic comprises:
a three input OR gate;
a first AND gate configured to receive the first edge output and the second edge output and provide a first output to a first input of the three input OR gate;
a second AND gate configured to receive the first edge output and the third edge output and provide a second output to a second input of the three input OR gate; and
a third AND gate configured to receive the second edge output and the third edge output and provide a third output to a third input of the three input OR gate.

* * * * *